United States Patent
Soer et al.

(10) Patent No.: US 7,952,084 B2
(45) Date of Patent: May 31, 2011

(54) RADIATION SOURCE AND LITHOGRAPHIC APPARATUS

(75) Inventors: Wouter Anthon Soer, Nijmegen (NL); Maarten Marinus Johannes Wilhelmus Van Herpen, Heesch (NL); Martin Jacobus Johan Jak, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 232 days.

(21) Appl. No.: 12/431,367

(22) Filed: Apr. 28, 2009

(65) Prior Publication Data

US 2009/0272916 A1    Nov. 5, 2009

Related U.S. Application Data

(60) Provisional application No. 61/071,441, filed on Apr. 29, 2008, provisional application No. 61/136,131, filed on Aug. 14, 2008, provisional application No. 61/136,304, filed on Aug. 26, 2008, provisional application No. 61/136,519, filed on Sep. 11, 2008, provisional application No. 61/193,511, filed on Dec. 4, 2008.

(51) Int. Cl.
   *G01N 21/33* (2006.01)
   *G21K 5/04* (2006.01)
   *G21F 1/12* (2006.01)
   *H05G 2/00* (2006.01)

(52) U.S. Cl. ............ 250/504 R; 250/365; 250/372; 250/515.1; 250/492.1; 355/30

(58) Field of Classification Search ......... 250/504 R, 250/365, 372, 515.1, 492.1; 355/30; 315/111.21
See application file for complete search history.

(56) References Cited

U.S. PATENT DOCUMENTS

| | | | |
|---|---|---|---|
| 7,737,425 B2 * | 6/2010 | Bakker et al. | 250/515.1 |
| 2003/0006383 A1 | 1/2003 | Melnychuk et al. | |
| 2004/0184014 A1 * | 9/2004 | Bakker et al. | 355/30 |
| 2005/0199829 A1 | 9/2005 | Partlo et al. | |
| 2006/0192151 A1 | 8/2006 | Bowering et al. | |
| 2007/0114469 A1 | 5/2007 | Partlo et al. | |
| 2010/0200772 A1 * | 8/2010 | Bakker et al. | 250/492.1 |

FOREIGN PATENT DOCUMENTS

EP    1 274 287 B1    6/2005

OTHER PUBLICATIONS

European Search Report for European Application No. 09005144.2 dated Jul. 2, 2009.

* cited by examiner

*Primary Examiner* — Nikita Wells
(74) *Attorney, Agent, or Firm* — Pillsbury Winthrop Shaw Pittman LLP

(57) ABSTRACT

A radiation source is configured to generate extreme ultraviolet radiation. The radiation source includes a plasma formation site located at a position in which a fuel is contacted by a beam of radiation to form a plasma, a collector constructed and arranged to collect extreme ultraviolet radiation formed at the plasma formation site and form an extreme ultraviolet radiation beam, and a contamination barrier. The contamination barrier includes a plurality of foils at least partially located between the plasma formation site and the collector, and a rotatable base operatively connected to the plurality of foils. The rotatable base is configured to allow the beam of radiation to pass through the contamination barrier to the plasma formation site.

15 Claims, 6 Drawing Sheets

RADIATION SOURCE AND LITHOGRAPHIC APPARATUS

CROSS-REFERENCE TO RELATED APPLICATIONS

This application claims that benefit of priority from U.S. Provisional Patent Application Nos. 61/071,441, filed Apr. 29, 2008, 61/136,131, filed Aug. 14, 2008, 61/136,304, filed Aug. 26, 2008, 61/136,519, filed Sep. 11, 2008, and 61/193,511, filed Dec. 4, 2008, the entire contents of all of which are incorporated herein by reference.

FIELD

The present invention relates to a radiation source and a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction.

A theoretical estimate of the limits of pattern printing can be given by the Rayleigh criterion for resolution as shown in equation (1):

$$CD = k_1 * \frac{\lambda}{NA_{PS}} \quad (1)$$

where $\lambda$ is the wavelength of the radiation used, $NA_{PS}$ is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture $NA_{PS}$ or by decreasing the value of $k_1$.

In order to shorten the exposure wavelength and, thus, reduce the minimum printable size, it has been proposed to use an extreme ultraviolet (EUV) radiation source. An EUV radiation source may be configured to output radiation having a wavelength for example within the range of 10-20 nm. Thus, EUV radiation sources may constitute a significant step toward achieving a reduction of the critical dimension which may be achieved using lithographic apparatus. Such radiation is termed extreme ultraviolet or soft x-ray, and possible sources include, for example, laser produced plasma sources, discharge plasma sources, or synchrotron radiation from electron storage rings.

In a laser produced plasma source, a laser beam is directed onto droplets of fuel, thereby causing the fuel to vaporize and form a plasma. The plasma emits EUV radiation which is collected by a collector (often a curved mirror) and focused to a focal point. In some instances, vaporization of the droplets of fuel may be incomplete. As a result of this incomplete vaporization, debris is introduced into the source and may accumulate on the collector. In addition, vaporized fuel (which may also be considered to be debris) may remain in the source and may also accumulate on the collector. The accumulation of debris on the collector causes the collector to lose reflectivity over a period of time. As a consequence of this, it may be necessary to periodically remove and replace or clean the collector. Operation of the lithographic apparatus is suspended while the collector is being replaced or cleaned, causing an interruption in the patterning of substrates.

It is desirable to reduce the incidence of debris on the collector of a laser produced plasma source, since this will extend the intervals between replacement or cleaning of the collector.

SUMMARY

According to an aspect of the invention, there is provided a radiation source configured to generate extreme ultraviolet radiation. The radiation source includes a plasma formation site located at a position in which a fuel is contacted by a beam of radiation to form a plasma, a collector constructed and arranged to collect extreme ultraviolet radiation formed at the plasma formation site and form an extreme ultraviolet radiation beam, and a contamination barrier. The contamination barrier includes a plurality of foils at least partially located between the plasma formation site and the collector, and a rotatable base operatively connected to the plurality of foils. The rotatable base is configured to allow the beam of radiation to pass through the contamination barrier to the plasma formation site.

The collector may include an aperture and the rotatable base of the contamination barrier may extend through the aperture.

The plurality of foils may have distal ends which are positioned such that droplets radially emitted from the distal ends during use do not hit the collector.

The rotatable base may be tapered.

The contamination barrier may also include a support which is constructed and arranged to support an end of the rotatable base.

The radiation source may also include a droplet generator constructed and arranged to deliver droplets of the fuel to the plasma formation site, the droplet generator being synchronized with rotation of the contamination barrier so that droplets are not generated when a droplet would hit one of the struts.

At least some of the plurality of foils may extend past the plasma formation site, the support being located beyond the plasma formation site relative to the collector.

According to an aspect of the invention there is provided a lithographic apparatus comprising a radiation source according to embodiments of the invention.

According to an aspect of the invention there is provided a lithographic apparatus that includes a radiation source configured to generate extreme ultraviolet radiation. The radiation source includes a plasma formation site located at a position in which a fuel is contacted by a beam of radiation to form a plasma, a collector constructed and arranged to collect extreme ultraviolet radiation formed at the plasma formation site and form an extreme ultraviolet radiation beam, and a contamination barrier. The contamination barrier includes a plurality of foils at least partially located between the plasma formation site and the collector, and a rotatable base operatively connected to the plurality of foils, the rotatable base being configured to allow the beam of radiation to pass through the contamination barrier to the plasma formation site. The lithographic apparatus also includes a support constructed and arranged to support a patterning device, the patterning device being configured to pattern the extreme ultraviolet radiation beam, and a projection system constructed and arranged to project the patterned extreme ultraviolet radiation beam onto a substrate.

According to an aspect of the invention there is provided a method of generating extreme ultraviolet radiation. The method includes contacting fuel with a beam of radiation to form a plasma, collecting extreme ultraviolet radiation formed by the plasma with a collector, forming an extreme ultraviolet radiation beam with the collector, and rotating a plurality of foils on a rotatable base. The foils are at least partially located between the plasma and the collector such that debris particles are intercepted by the foils. The beam of radiation is passed through the rotatable base before contacting the fuel to form the plasma.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
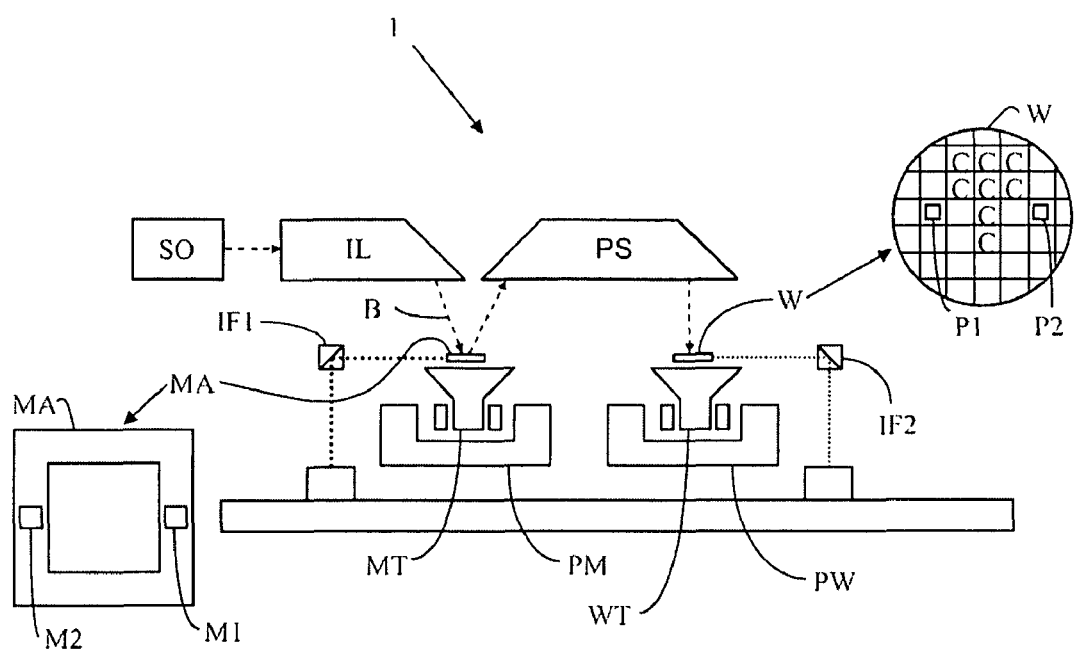
FIG. 1 depicts a lithographic apparatus according to an embodiment of the invention.

FIG. 1 schematically depicts a lithographic apparatus 1 according to an embodiment of the invention. The apparatus includes: an illumination system (illuminator) IL configured to condition a radiation beam B (e.g. extreme ultraviolet radiation); a support structure or support (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system including, for example, suitable directing mirrors and/or a beam expander. In other cases the source may be an integral part of the lithographic apparatus, for example when the source is a mercury lamp. The source SO and the illuminator IL, together with the beam delivery system if required, may be referred to as a radiation system.

The illuminator IL may include an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. After being reflected by the patterning device (e.g. mask) MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device (e.g. mask) MA with respect to the path of the radiation beam B, e.g. after mechanical retrieval from a mask library, or during a scan. In general, movement of the support structure (e.g. mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the mask alignment marks may be located between the dies.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
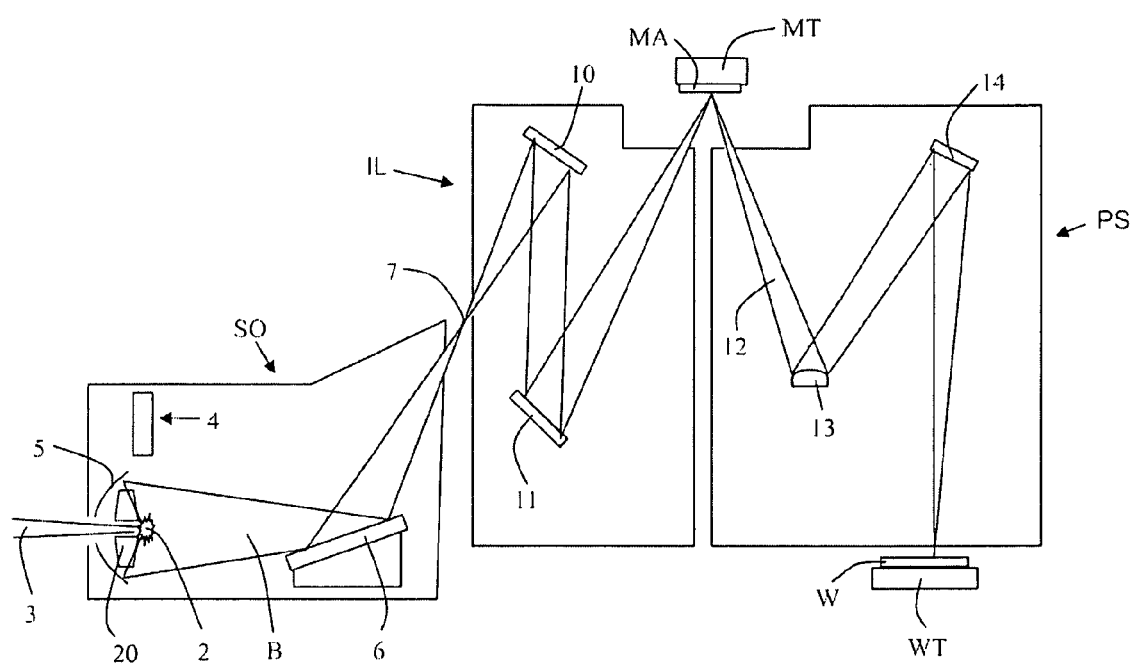
FIG. 2 depicts the lithographic apparatus of FIG. 1 in more detail.

FIG. 2 shows the apparatus of FIG. 1 in more detail, including the source SO, the illuminator IL, and the projection system PS. The source SO generates extreme ultraviolet (EUV) radiation from a plasma 2. The plasma 2 is created by directing a laser beam 3 onto droplets of a suitable material such as Sn or Gd which are generated by a droplet generator 4. A laser beam 3 causes the droplets to be vaporized, thereby generating the plasma 2.

Radiation emitted by the plasma 2 is collected by a collector 5 to form an EUV radiation beam B. The EUV radiation beam B is directed onto a grating spectral filter 6. The EUV radiation beam then passes from the grating spectral filter 6 to an intermediate focus 7. The intermediate focus 7 acts as a virtual source point at an aperture in the source SO. The EUV radiation beam is reflected in the illuminator IL via first and second normal incidence reflectors 10, 11 onto a patterning device MA (e.g. a mask) positioned on support structure MT. A patterned EUV radiation beam 12 is formed which is imaged in the projection system PS via first and second reflective elements 13, 14 onto a substrate W held on a substrate table WT. More elements than shown may generally be present in the illuminator IL and projection system PS.

Also shown in FIG. 2 is a contamination barrier 20 which comprises plurality of rotating foils located at least partially between the collector 5 and the location at which the plasma 2 is formed. The contamination barrier is configured to reduce the amount of debris which is incident upon the collector 5 during operation of the source SO.

Fuel droplets which are used by the source may for example be formed from tin (Sn). Different types of debris may be generated in the source. The first is slow atomic debris, such as thermalized atoms, i.e. with random direction and velocity according to the Maxwell distribution. The second is fast atomic debris, such as ions, neutrals and nanoclusters with a high ballistic velocity which may travel in the same direction as radiation generated by the plasma. The third type of debris is particles, which may include micrometer-sized ballistic particles which also travel in the same direction as radiation generated by the plasma. Particles may for example be generated when vaporization of the fuel droplets by the laser beam 3 is incomplete (e.g. if the fuel droplets are not mass limited).

Figure 3:
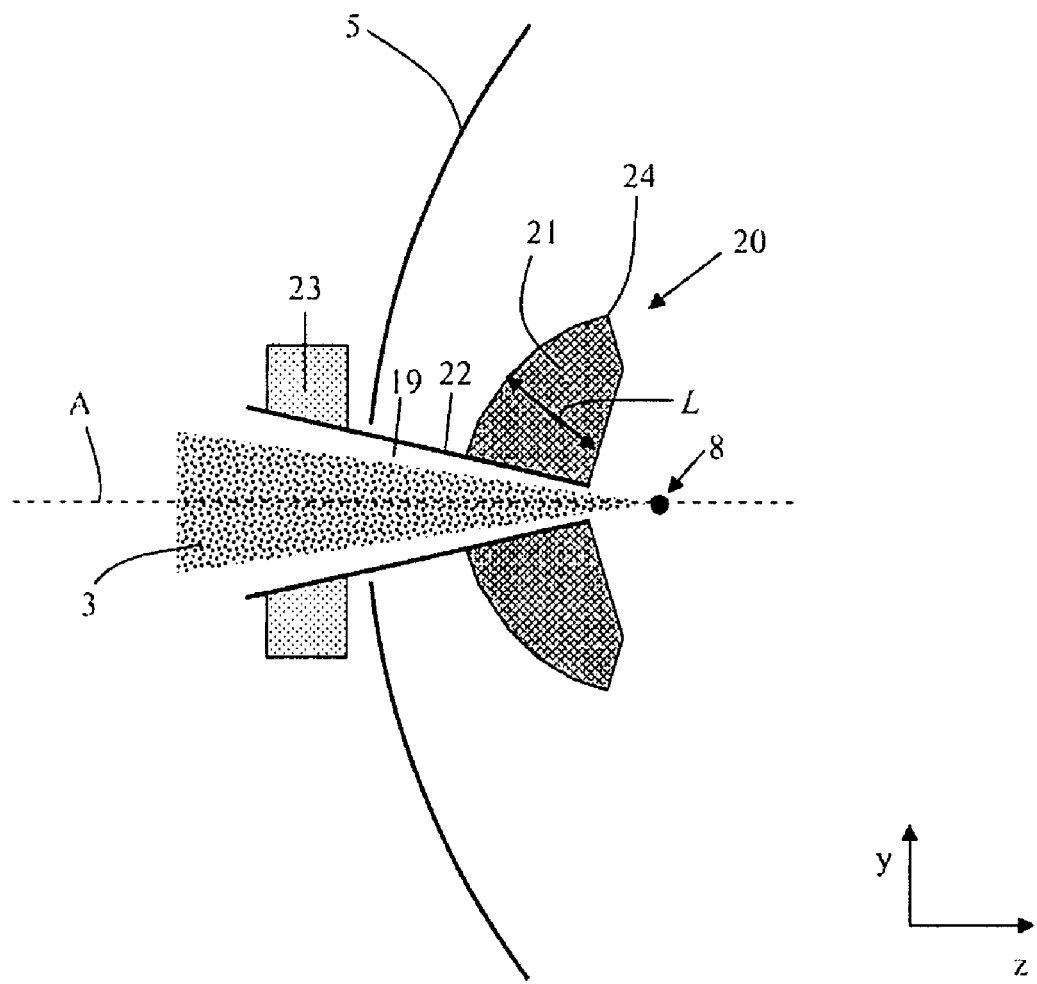
FIG. 3 depicts an embodiment of a radiation source of the lithographic apparatus of FIG. 1.

Part of the source is shown in more detail in FIG. 3. Droplets of fuel (not shown) are delivered to a plasma formation site 8 and are ignited by the laser beam 3 to form a plasma at the plasma formation site 8. The collector 5, which is a normal incidence collector, is configured to collect extreme ultraviolet radiation which is emitted by the plasma. The contamination barrier 20 is a rotating foil trap that includes a plurality of foils 21, a rotatable base 22, and a drive apparatus 23. The rotatable base 22 passes through an aperture in the collector 5 (the aperture may be provided in the center of the collector 5). The rotatable base 22 is hollow in order to allow the laser beam 3 to pass through the rotatable base 22. The drive apparatus 23 is desirably located behind the collector 5 so that it does not block any EUV radiation that is emitted by the plasma.

The rotatable base 22 tapers towards the plasma formation site 8. As can be seen in FIG. 3, the tapering of the rotatable base 22 assists the rotatable base in accommodating the laser beam 3. The laser beam 3 is focused onto the plasma formation site 8, and as a consequence the diameter of the laser beam reduces significantly as it travels through the rotatable base 22. The tapering of the rotatable base 22 corresponds generally with the shape the laser beam 3 (although a gap 19 may exist between the inner surface of the rotatable base 22 and the laser beam 3). The rotatable base may have any suitable shape. For example, the base may be in the form of a shaft that is cylindrical. However, tapering the rotatable base 22 reduces the proportion of EUV radiation which is blocked by the rotatable base, compared with the proportion of EUV radiation which would be blocked if the base were to be cylindrical.

The term "rotatable base" is intended to include any suitable rotatable apparatus which may carry the foils. It is not intended to be limited to for example a cylindrical, frusto-conical or conical shape.

The foils 21 may be made for example from a refractory metal, an alloy of a refractory metal, or a superalloy based on for example nickel, nickel-iron or cobalt. The foils may be made from a material which has high mechanical strength and creep resistance at high temperature During operation of the source, the drive apparatus 23 drives the rotatable base 22 to rotate about a rotation axis A, thereby rotating the foils 21. This rotation of the foils 21 allows them to intercept debris particles, thereby preventing those intercepted debris particles from the reaching the collector 5. Following interception by the foils 21, the debris particles are projected from the foils centrifugally in a direction perpendicular to the rotation axis A. The interception and subsequent ejection of the debris particles by the foils 21 reduces the rate at which debris accumulates on the collector 5, thereby extending the intervals between replacement or cleaning of the collector (i.e. allowing the lithographic apparatus to operate for longer).

The rotation axis A of the rotatable base 22 may correspond with the path of the laser beam 3. In addition, the rotation axis A of the rotatable base 22 may also correspond with the optical axis of the lithography system.

The ability of the contamination barrier 20 to suppress debris particles may be expressed in terms of a "stopping speed", i.e. the maximum speed of debris particles that are fully intercepted by the foils 21. The stopping speed is given by $$v = NLf \qquad (2)$$

where N is the number of foils, L is the length of the foils along the radial path from the source, and f is the rotation frequency of the contamination barrier. An example of a radial path L is shown in FIG. 3.

The shape of the foils 21 may be such that a minimum length L, and hence a corresponding minimum stopping speed v, is attained over the entire collection angle (i.e. over all angles from which the collector 5 receives EUV radiation and debris from the plasma). The foils 21 may be shaped such that the foils are longer at their base (measuring in a direction parallel to the optical axis) than at a point midway between their base and their distal end. The foils 21 may be shaped such that the foils are longer at their base (measuring in a radial direction from the plasma formation site 8) than at a point midway between their base and their distal end.

Other factors may also influence the design of the foils and the foil trap, for example, mechanical stability and the trajectory of re-emitted droplets. Regarding the latter, it has been found that a substantial part of the droplets are re-emitted radially (i.e. with respect to the rotation axis A) from the point of the foils 21 that is most distal from the rotation axis A. Therefore, in an embodiment, the foils 21 have a distal end 24 which is positioned such that droplets radially emitted from this distal end do not hit the collector 5. The foils 21 may narrow to a point, such that the distal end 24 is pointed. Alternatively, the foils may include a curved tip (not illustrated) at the distal end.

In an embodiment, the foils 21 of the contamination barrier 20 are positioned (e.g. the foils are constructed and arranged) such that droplets radially emitted from any point on the foils do not hit the collector 5. The foils may be constructed and arranged such that there is no overlap in the radial direction (i.e. transverse to the optical axis A) between the foils and the collector. This may be achieved for example by making the foils 21 shorter in the direction of the optical axis and/or moving the foils 21 closer to the plasma formation site 8.

Figure 4A:
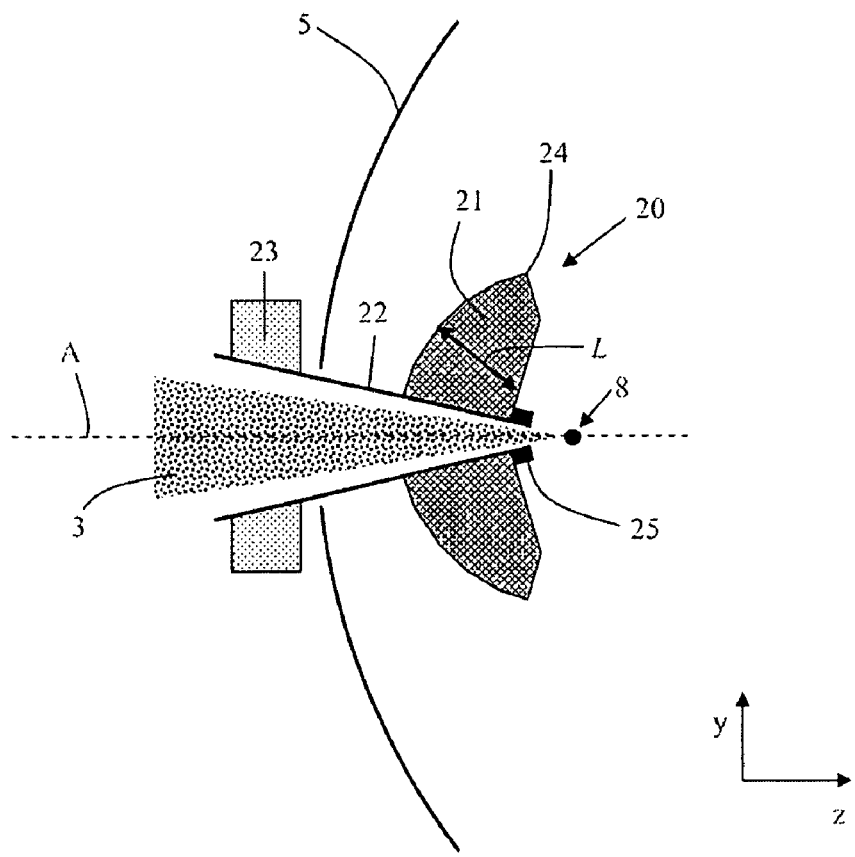
FIGS. 4a and 4b depict an embodiment of a radiation source of the lithographic apparatus of FIG. 1.
Figure 4B:
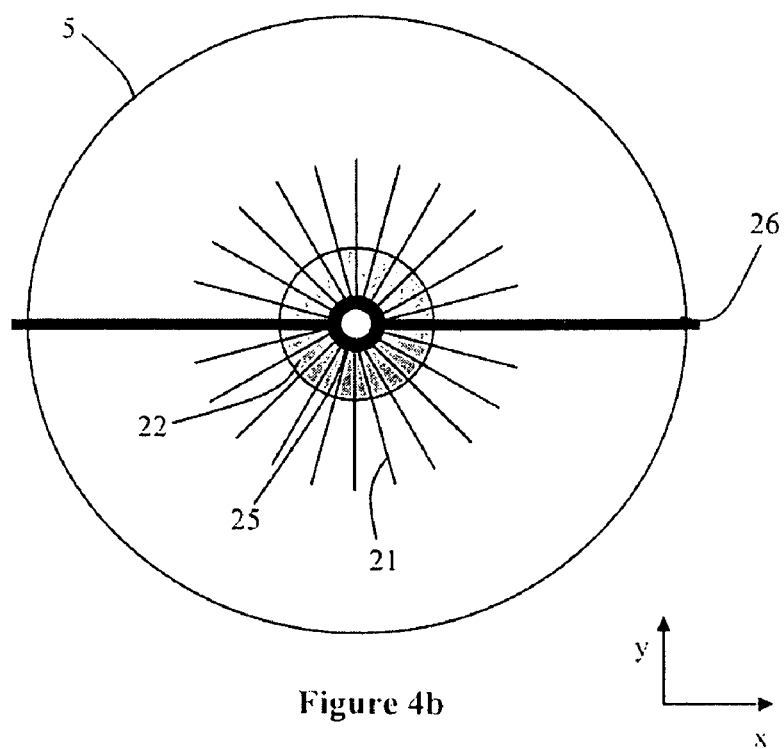

FIGS. 4a and 4b show an embodiment of the invention which may improve the mechanical stability of the contamination barrier 20 (reference numerals used in FIGS. 4a and 4b correspond with those used in FIG. 3 where appropriate). FIG. 4a shows the contamination barrier 20 as viewed from the side in cross-section, and FIG. 4b shows the contamination barrier as viewed from the front (i.e. as seen from the plasma formation site 8). The rotatable base 22 of the contamination barrier 20 is supported by a support 26 which is provided on a side of the plasma formation site 8 that is closest to the collector 5. The support 26 extends across the collector, between the collector and the plasma formation site 8. The support extends from walls (not shown) of the source or to some other structure. The support 26 may be constructed and arranged to generally obscure only a small part of the collection angle of the collector 5, so as to limit the amount of EUV radiation which is blocked by the support 26. The support 26 may be aligned with some other existing apparatus which also blocks radiation, such as for example a laser beam stop (not shown in FIG. 4a). This may allow the support 26 to be provided without the support reducing the amount of EUV radiation which is collected by the collector 5 and focused at the intermediate focus 7. Although the support 26 is shown as extending from the rotatable base 22 in two directions, it may for example extend in only one direction (or any other number of directions).

An annular bearing 25 may be provided between the support 26 and the rotatable base 22. The annular bearing 25 may for example be a ball bearing or a liquid metal bearing.

Figure 5A:
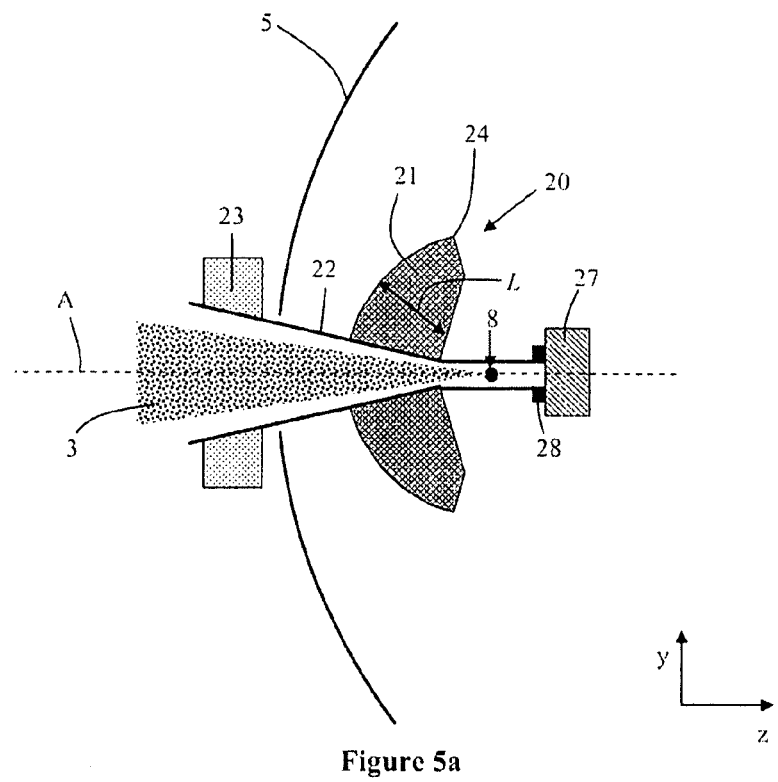
FIGS. 5a-5d depict an embodiment of a radiation source of the lithographic apparatus of FIG. 1.
Figures 5B, 5C:
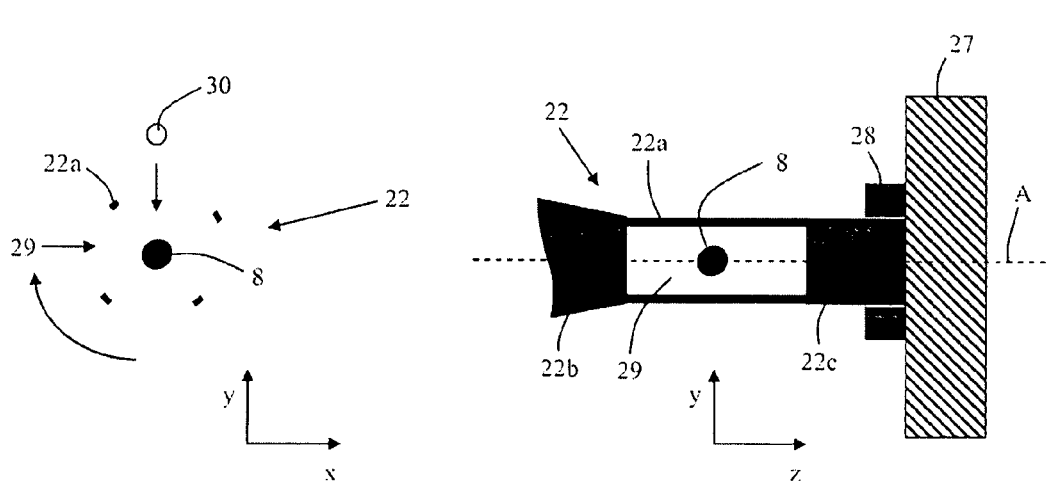

In an embodiment, the rotatable base 22 may extend beyond the plasma formation site 8 in order to improve the mechanical stability of the contamination barrier 20. This embodiment is shown in FIGS. 5a-5c (reference numerals used in FIGS. 5a-5c correspond with those used in FIGS. 3, 4a and 4b where appropriate). FIG. 5a shows the contamination barrier in cross-section. The rotatable base 22 extends past the plasma formation site 8 and is supported by a support 27 at a location which is beyond the plasma formation site relative to the collector. The support 27 may for example be a beam dump which is arranged to receive the laser beam 3. An annular bearing 28 may be provided between the rotatable base 22 and the support 27. The annular bearing 28 may for example be a ball bearing or a liquid metal bearing.

That part of the rotatable base 22 that extends past the plasma formation site 8 is made partially open. FIG. 5b shows a cross-section along axis A at the plasma formation site 8, and FIG. 5c shows part of the rotatable base 22 viewed from the side. As can be seen from FIG. 5b, in the vicinity of the plasma formation site 8 the rotatable base 22 comprises four struts 22a which are equally distributed about the axis of rotation. As can be seen from FIG. 5c, the four struts are connected at one end to an outwardly tapering part 22b of the rotatable base 22 (only some of the outwardly tapering part is shown), and are connected at an opposite end to a cylindrical part 22c of the rotatable base. The cylindrical part 22c of the rotatable base is received by the annular bearing 28 and the support 27.

Openings 29 between the struts 22a allow the majority of EUV radiation which is emitted from the plasma formation site 8 to pass out of the rotatable base 22 and towards the collector 5.

The openings 29 also allow fuel droplets 30 to travel to the plasma formation site 8. Projection of fuel droplets 30 towards the plasma formation site 8 by the droplet generator 4 (see FIG. 2) may be synchronized with rotation of the rotatable base 22, such that the fuel droplets pass through openings 29 to the plasma formation site 8 and do not hit the struts 22a. Alternatively or additionally, the laser beam 3 may be synchronized with rotation of the rotatable base 22, such that when one of the struts 22a blocks a fuel droplet from reaching the plasma formation site 8, the laser is not incident on the plasma formation site. This may be achieved for example by not firing the laser, or by blocking the laser beam 3 before it enters the source.

Although four struts 22a are shown in FIG. 5b, any suitable number of struts may be used. For example, the number of struts may be 2, 3, 4, 5, etc. Increasing the number of struts may increase the mechanical stability of the contamination barrier, but may block more EUV radiation.

The struts 22a and cylindrical portion 22c of the rotatable base 22 shown in FIG. 5a-c are arranged to rotate. In an alternative arrangement, shown in FIG. 5d, struts 31 and a cylindrical portion 32 are fixed to the support 27 and do not rotate. The cylindrical portion 32 is fixed to the support 27 by any suitable means, such as for example welding or using one or more bolts. Similarly, the struts 31 are fixed to the support 27 by any suitable means. The struts 31 and cylindrical portion 32 may be formed from a single piece of material. The support 27, cylindrical portion 32 and struts 31 may be formed from a single piece of material. The cylindrical portion 32 is mentioned as an example, and is need not necessarily be cylindrical (it may be any suitable shape). The struts 31 may be connected directly to the support 27 (i.e. without the cylindrical portion being present).

Figure 5D:
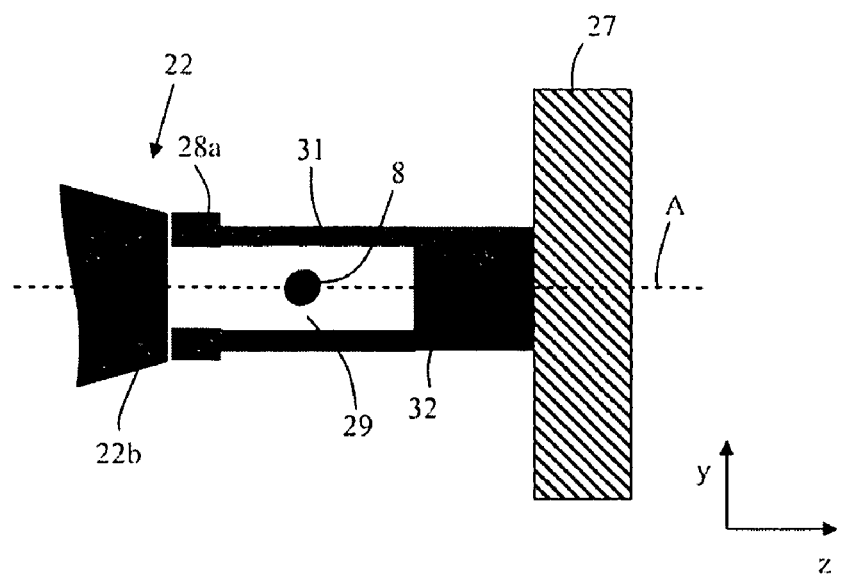

The rotatable base 22 is connected to the struts 31, for example via bearings 28a. This provides the rotatable base 22 with support, while allowing it to rotate. A potential advantage of the arrangement shown in FIG. 5d is that spaces 29 between the struts 31 do not move, providing a permanently clear path for fuel droplets to travel to the plasma formation site 8.

Figure 6:
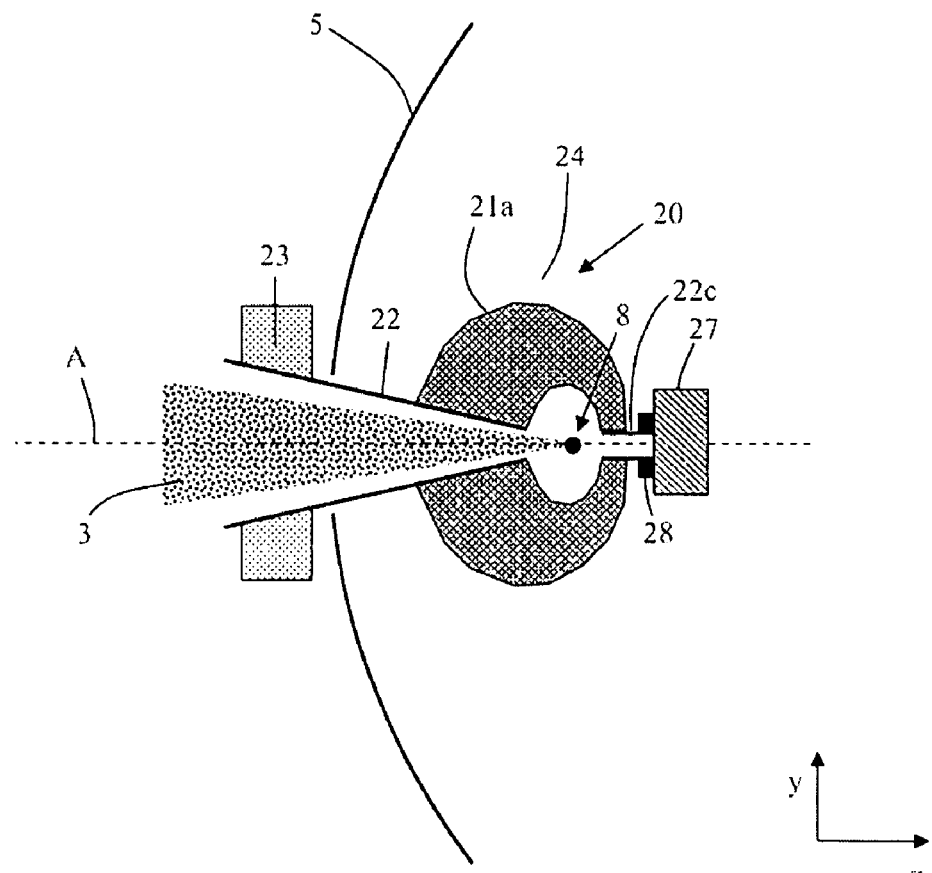
FIG. 6 depicts an embodiment of a radiation source of the lithographic apparatus of FIG. 1.

An embodiment of the invention is shown in FIG. 6 (reference numerals used in FIG. 6 correspond with those used in FIGS. 3-5d where appropriate). In the embodiment shown in FIG. 6, foils 21a of the contamination barrier 20 extend past the plasma formation site 8 (i.e. extend to a location which is beyond the plasma formation site relative to the collector 5). The foils are connected to a cylindrical portion 22c of the rotatable base 22. The cylindrical portion 22c of the rotatable base is supported by the support 27. An annular bearing 28 is provided between the cylindrical portion 22c of the rotatable base 22 and the support 27.

In the embodiment shown in FIG. 6, the portion of the rotatable base which passes over the plasma formation site 8 is formed from the foils themselves 21a rather than from struts.

It is not necessary that all of the foils pass over the plasma formation site 8. Some of the foils may stop short of the plasma formation site 8, for example having a construction as described above in relation to FIGS. 3-5d. In an embodiment, four of the foils 21a may pass over the plasma formation site 8 and be connected to the support 27 (e.g. for example via the cylindrical part 22c of the rotatable base), with the remaining foils stopping short of the plasma formation site. In alternative embodiments, 2, 3, 5, 6, etc. foils may be connected to the support 27, with the remaining foils for example stopping short of the plasma formation site 8.

Those foils 21a which are connected to the support 27 may be thicker than the foils which stop short of the plasma formation site 8. In other words, those foils which have a mechanical function may be thicker than those foils whose only function is to intercept debris. The foils 21a that are connected to the support 27 may act both to provide a mechanical connection to the support, and to intercept debris.

An innermost edge of those foils 21a which are connected to the support 27 may curve around the plasma formation site 8, the curve keeping the innermost edge of the foils further away from the plasma formation site than would otherwise be the case (i.e. if the curve were not present). The curve may for example be shaped such that no portion of the foils 21a comes closer than a predetermined distance to the plasma formation site 8. For example, the curve may be shaped such that no portion of the foils 21a comes closer than 3 cm (or some other suitable distance) to the plasma formation site 8.

In order to keep the contamination barrier 20 cool, a cooling system (not shown) may be provided in the drive apparatus 23. The cooling system may help to keep the foils 21, 21a cool. The cooling system may be any suitable cooling system, and may provide active cooling.

In embodiments where the rotatable base 22 is supported by the support 27 in a location which is beyond the plasma formation site relative to the collector 5, a cooling system may be provided at the support 27. The cooling system may help to keep the foils 21, 21a cool, and may help to keep the struts 22a cool. The cooling system may be any suitable cooling system, and may provide active cooling. The cooling system may provide cooling via the annular bearings 28, which may for example be liquid metal bearings.

In embodiments in which a non-rotating support 26, 31 is provided at an end of the foils which is adjacent to the plasma formation site (e.g. embodiments shown in FIGS. 4 and 5d), a cooling system may be provided in the non-rotating part 26, 31. This may assist in cooling the foils 21 of the contamination barrier, since cooling is provided close to the foils. The cooling system may provide cooling via the annular bearings 28, which may for example be liquid metal bearings.

In the illustrated embodiments of the invention, ignition of the fuel droplets 30 has been described as being achieved using a laser beam 3. However, a radiation beam which is generated by a source other than a laser may be used.

Embodiments of the present invention provide an LPP source with a coaxial arrangement of the rotating foil trap and the laser beam, wherein the rotatable base of the rotating foil trap is hollow in order to let the laser beam pass through. This arrangement may have the following advantages: (i) both the plasma formation and the foil trap transmission are rotationally symmetric about the optical axis; (ii) the amount of collectable EUV radiation is not substantially affected; and (iii) particles that are re-emitted by the rotating foil trap are deposited outside the collector.

Embodiments of the invention may reduce the rate at which debris accumulates on the collector of the lithographic apparatus, thereby extending the intervals between cleaning or replacement of the collector. This may be expressed as saying that embodiments of the invention may extend the lifetime of the collector.

Although it may be known from the prior art to use a rotating foil trap as a contamination barrier, this is in a discharge-produced plasma (DPP) EUV source combined with a grazing-incidence collector. In the DPP source, the rotating foil trap is placed between the source and the grazing-incidence collector, with the rotatable base coinciding with the optical axis. The optical axis of the DPP source provides a natural location for the rotatable base of the rotating foil trap, since the amount of EUV which is collected along the optical axis is not substantial.

The prior art does not teach or suggest providing a rotating foil trap in a LPP source. Furthermore, there is no natural location in which to provide the rotatable base. The invention therefore provides an inventive step when compared with the prior art.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term extreme ultraviolet (EUV) radiation as used above may be interpreted as meaning electromagnetic radiation having a wavelength of less than 20 nm, for example within the range of 10-20 nm, for example within the range of 13-14 nm, for example within the range of 5-10 nm, for example such as 6.7 nm or 6.8 nm.

The term "lens", where the context allows, may refer to any one or combination of various types of optical components, including refractive, reflective, magnetic, electromagnetic and electrostatic optical components.

The descriptions above are intended to be illustrative, not limiting. Thus, it will be apparent to one skilled in the art that modifications may be made to the invention as described without departing from the scope of the claims set out below.

What is claimed is:

1. A radiation source configured to generate extreme ultraviolet radiation, the radiation source comprising:
   a plasma formation site located at a position in which a fuel is contacted by a beam of radiation to form a plasma;
   a collector constructed and arranged to collect extreme ultraviolet radiation formed at the plasma formation site and form an extreme ultraviolet radiation beam; and
   a contamination barrier comprising a plurality of foils at least partially located between the plasma formation site and the collector, and a rotatable base operatively connected to the plurality of foils, the rotatable base being configured to allow the beam of radiation to pass through the contamination barrier to the plasma formation site.

2. The radiation source according to claim 1, wherein the collector comprises an aperture and the rotatable base of the contamination barrier extends through the aperture.

3. The radiation source according to claim 1, wherein the beam of radiation is provided by a laser located away from the collector.

4. The radiation source according to claim 1, wherein the contamination barrier further comprises a drive apparatus that is located behind the collector relative to the plasma formation site.

5. The radiation source according to claim 1, wherein the plurality of foils have distal ends which are positioned such that droplets radially emitted from the distal ends during use do not hit the collector.

6. The radiation source according to claim 1, wherein the plurality of foils are constructed and arranged such that there is no overlap in the radial direction between the plurality of foils and the collector.

7. The radiation source according to claim 1, wherein the plurality of foils are constructed and arranged such that debris particles that are captured by the plurality of foils during use are radially emitted such that the debris particles do not hit the collector.

8. The radiation source according to claim 1, wherein the contamination barrier further comprises a support constructed and arranged to support an end of the rotatable base.

9. The radiation source according to claim 8, wherein the support extends across the collector, between the collector and the plasma formation site.

10. The radiation source according to claim 1, wherein the rotatable base extends past the plasma formation site.

11. The radiation source according to claim 10, wherein the rotatable base is supported by a beam stop.

12. The radiation source according to claim 10, wherein in the vicinity of the plasma formation site, the rotatable base comprises a plurality of struts.

13. The radiation source according to claim 12, further comprising a droplet generator constructed and arranged to deliver droplets of the fuel to the plasma formation site, the droplet generator being synchronized with rotation of the contamination barrier so that in use droplets do not hit one of the struts.

14. A lithographic apparatus comprising:
   a radiation source configured to generate extreme ultraviolet radiation, the radiation source comprising a plasma formation site located at a position in which a fuel is contacted by a beam of radiation to form a plasma, a collector constructed and arranged to collect extreme ultraviolet radiation formed at the plasma formation site and form an extreme ultraviolet radiation beam, and a contamination barrier comprising a plurality of foils at least partially located between the plasma formation site and the collector, and a rotatable base operatively connected to the plurality of foils, the rotatable base being configured to allow the beam of radiation to pass through the contamination barrier to the plasma formation site;

a support constructed and arranged to support a patterning device, the patterning device being configured to pattern the extreme ultraviolet radiation beam; and a projection system constructed and arranged to project the patterned extreme ultraviolet radiation beam onto a substrate.

15. A method of generating extreme ultraviolet radiation, the method comprising:

contacting fuel with a beam of radiation to form a plasma;

collecting extreme ultraviolet radiation formed by the plasma with a collector;

forming an extreme ultraviolet radiation beam with the collector; and rotating a plurality of foils on a rotatable base, the foils being at least partially located between the plasma and the collector such that debris particles are intercepted by the foils, wherein the beam of radiation is passed through the rotatable base before contacting the fuel to form the plasma.

* * * * *